(12) United States Patent
Anderson et al.

(10) Patent No.: US 7,791,166 B2
(45) Date of Patent: Sep. 7, 2010

(54) FORMATION OF DUMMY FEATURES AND INDUCTORS IN SEMICONDUCTOR FABRICATION

(75) Inventors: Brent Alan Anderson, Jericho, VT (US); Howard Smith Landis, Underhill, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 690 days.

(21) Appl. No.: 11/744,248

(22) Filed: May 4, 2007

(65) Prior Publication Data

US 2008/0272457 A1 Nov. 6, 2008

(51) Int. Cl.
*H01L 29/00* (2006.01)

(52) U.S. Cl. .............................. 257/531; 257/E21.022; 438/45; 438/514

(58) Field of Classification Search ................. 257/531, 257/E21.022; 438/45, 514; 336/205
See application file for complete search history.

(56) References Cited

U.S. PATENT DOCUMENTS

| | | | |
|---|---|---|---|
| 5,801,092 A | 9/1998 | Ayers | |
| 7,026,256 B2 | 4/2006 | Sohn | |
| 7,033,415 B2 | 4/2006 | Mirkin et al. | |
| 7,335,972 B2 * | 2/2008 | Chanchani | 257/686 |
| 7,473,999 B2 * | 1/2009 | Lin et al. | 257/738 |
| 2001/0019865 A1 * | 9/2001 | Erdeljac et al. | 438/239 |
| 2006/0099824 A1 | 5/2006 | Liu et al. | |
| 2006/0134347 A1 | 6/2006 | Chiruvolu et al. | |
| 2007/0099031 A1 * | 5/2007 | Chung et al. | 428/815 |

\* cited by examiner

*Primary Examiner*—Thanh V Pham
(74) *Attorney, Agent, or Firm*—Schmeiser, Olsen & Watts; Richard M. Kotulak (57) ABSTRACT

A structure and a method for forming the same. The structure includes (a) a substrate which includes a top substrate surface which defines a reference direction perpendicular to the top substrate surface, (b) N semiconductor regions on the substrate, and (c) P semiconductor regions on the substrate, N and P being positive integers. The N semiconductor regions comprise dopants. The P semiconductor regions do not comprise dopants. The structure further includes M interconnect layers on top of the substrate, the N semiconductor regions, and the P semiconductor regions, M being a positive integer. The M interconnect layers include an inductor. (i) The N semiconductor regions do not overlap and (ii) the P semiconductor regions overlap the inductor in the reference direction. A plane perpendicular to the reference direction and intersecting a semiconductor region of the N semiconductor regions intersects a semiconductor region of the P semiconductor regions.

11 Claims, 10 Drawing Sheets

FORMATION OF DUMMY FEATURES AND INDUCTORS IN SEMICONDUCTOR FABRICATION

FIELD OF THE INVENTION

The present invention relates generally to semiconductor device fabrication and more particularly to the formation of dummy features and inductors in semiconductor device fabrication.

BACKGROUND OF THE INVENTION

In a conventional semiconductor chip, the presence of dummy features often has a detrimental impact on the operation of an inductor of the semiconductor chip. Therefore, there is a need for a structure for the dummy features and the inductor (and a method for forming the same) in which the detrimental impact of the dummy features on the operation of the inductor is minimized.

SUMMARY OF THE INVENTION

The present invention provides a structure, comprising (a) a substrate which includes a top substrate surface which defines a reference direction perpendicular to the top substrate surface; (b) N semiconductor regions on the substrate, N being a positive integer, wherein the N semiconductor regions comprise dopants; (c) P semiconductor regions on the substrate, P being a positive integer, wherein the P semiconductor regions do not comprise dopants; and (d) M interconnect layers on top of the substrate, the N semiconductor regions, and the P semiconductor regions, M being a positive integer, wherein the M interconnect layers include an inductor, wherein the N semiconductor regions do not overlap the inductor in the reference direction, wherein the P semiconductor regions overlap the inductor in the reference direction, and wherein a plane perpendicular to the reference direction and intersecting a semiconductor region of the N semiconductor regions intersects a semiconductor region of the P semiconductor regions.

The present invention provides a structure of dummy features and inductors (and a method for forming the same) in which the detrimental impacts of the dummy features on the yield of the die containing the features and to the operation of the inductor are minimized.

DETAILED DESCRIPTION OF THE INVENTION

Figure 1A:
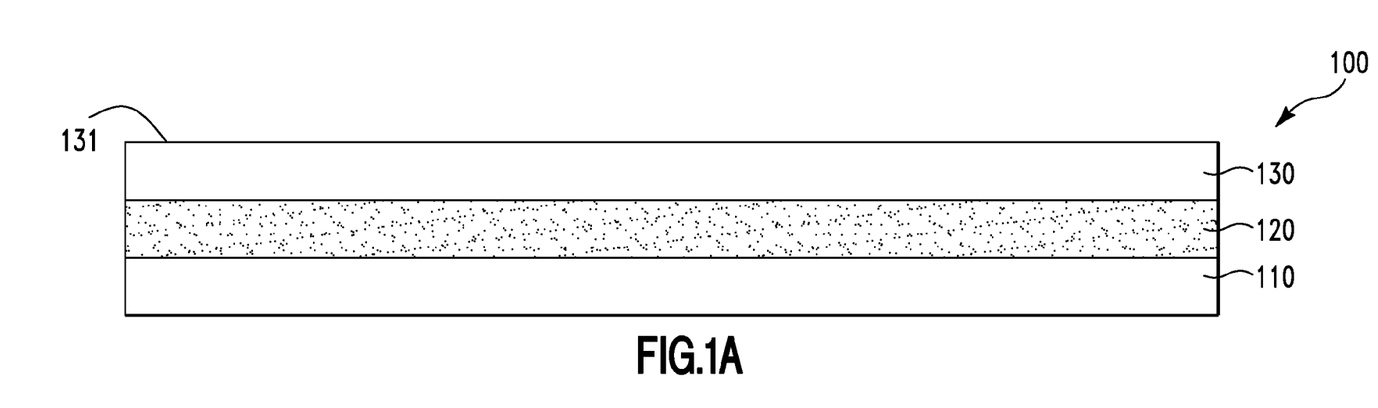
FIGS. 1A-1R illustrate a fabrication process for forming a semiconductor structure, in accordance with embodiments of the present invention.
Figure 1B:
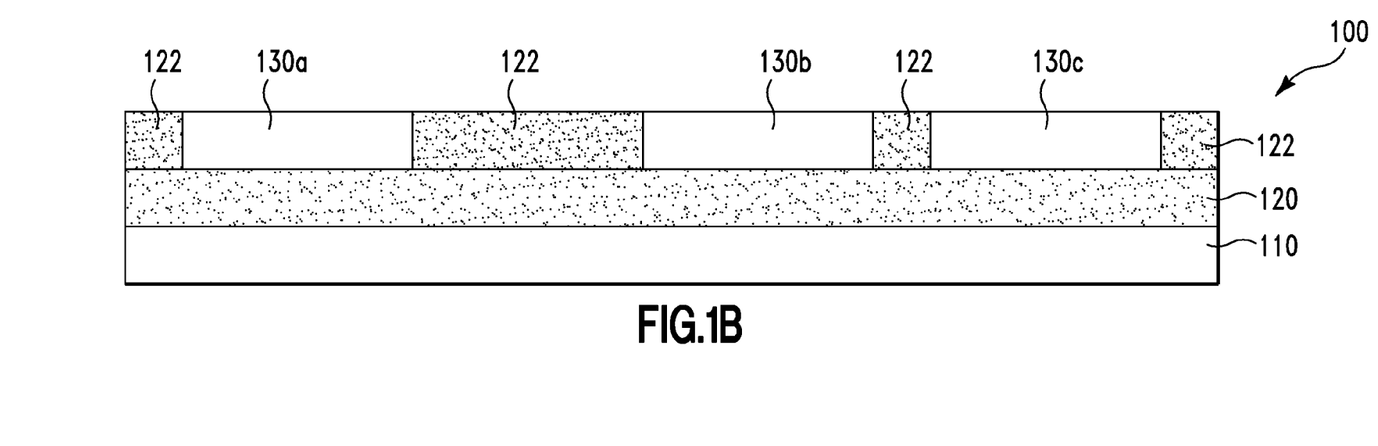
Figure 1C:
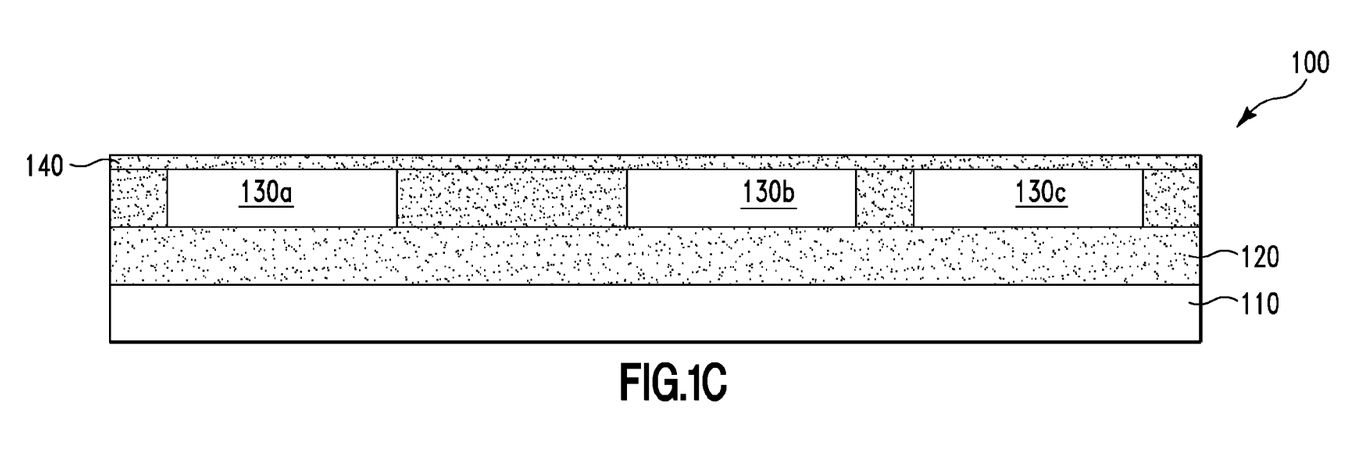
Figure 1D:
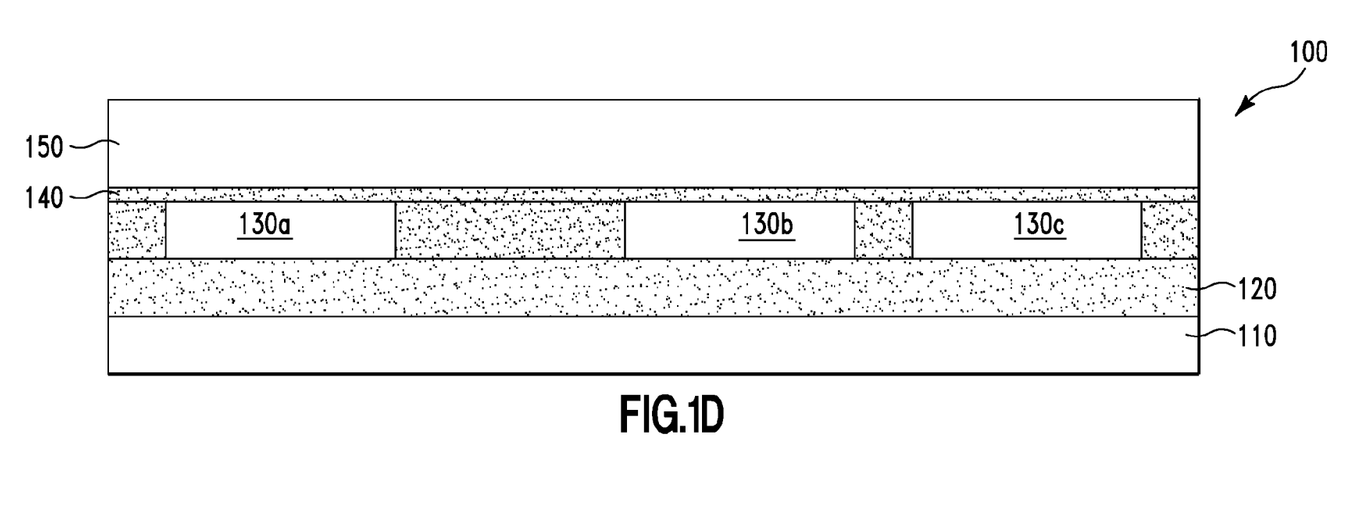
Figure 1E:
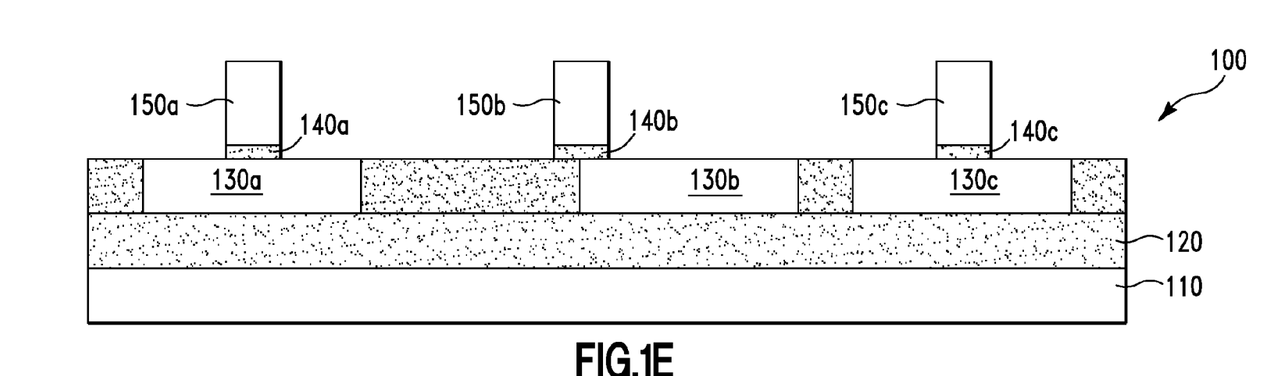
Figure 1F:
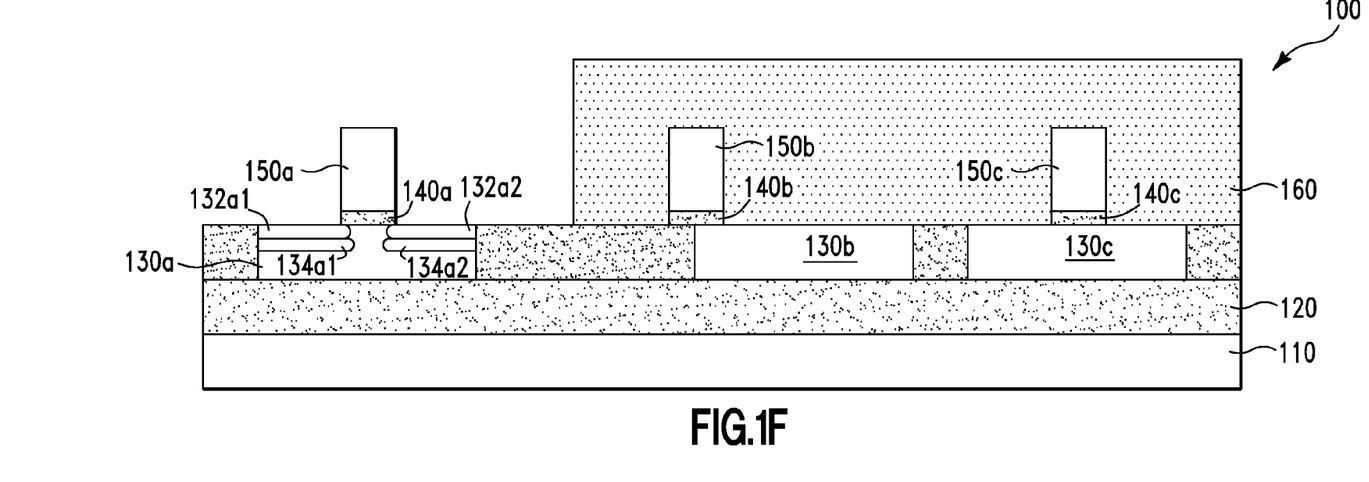
Figure 1G:
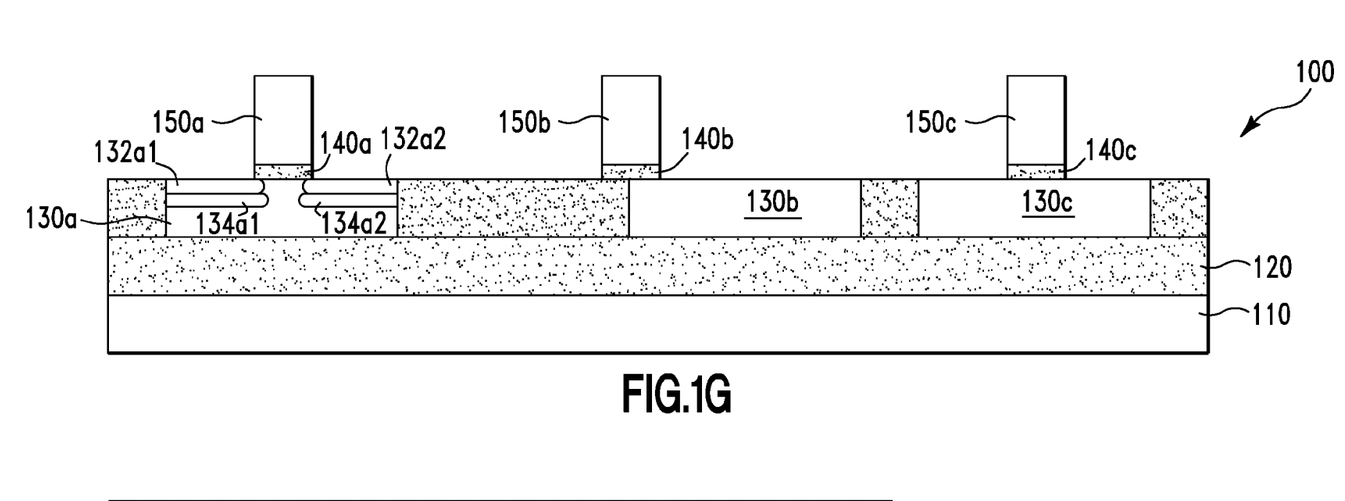
Figure 1H:
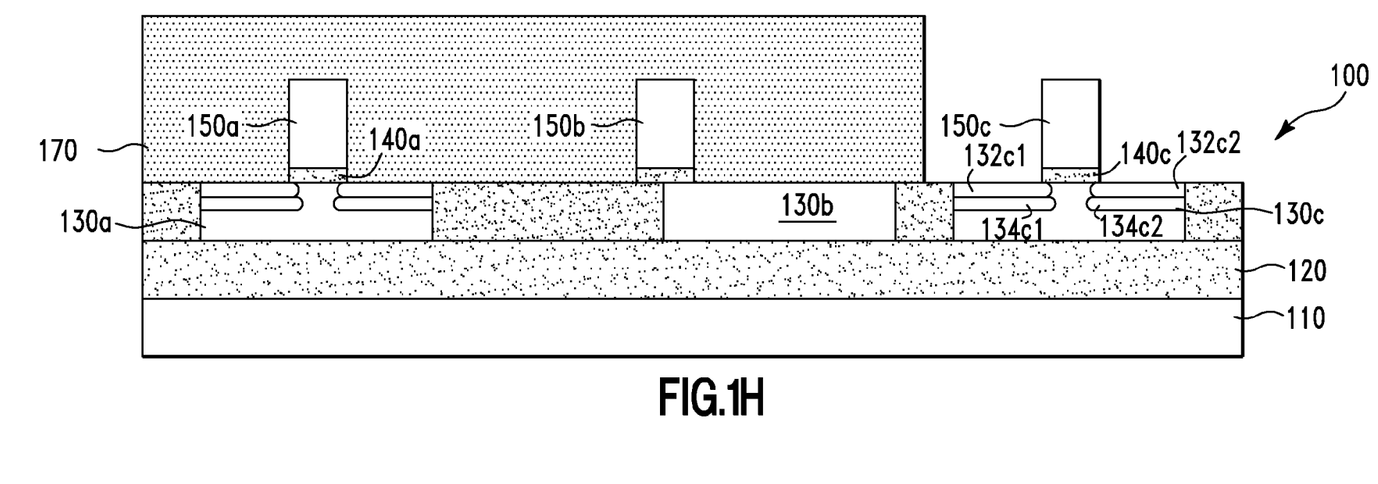
Figure 1I:
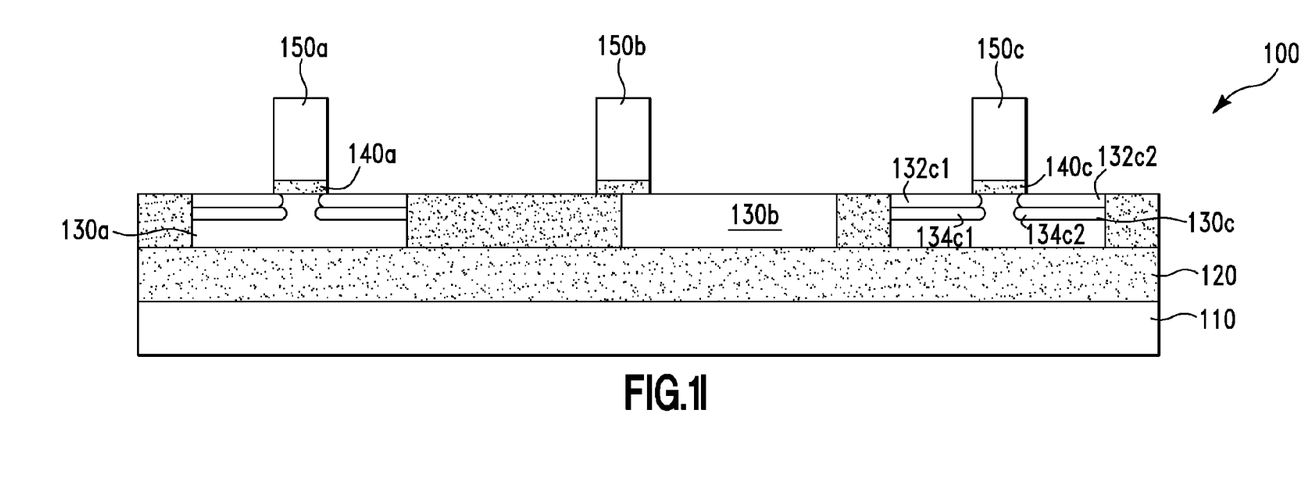
Figure 1J:
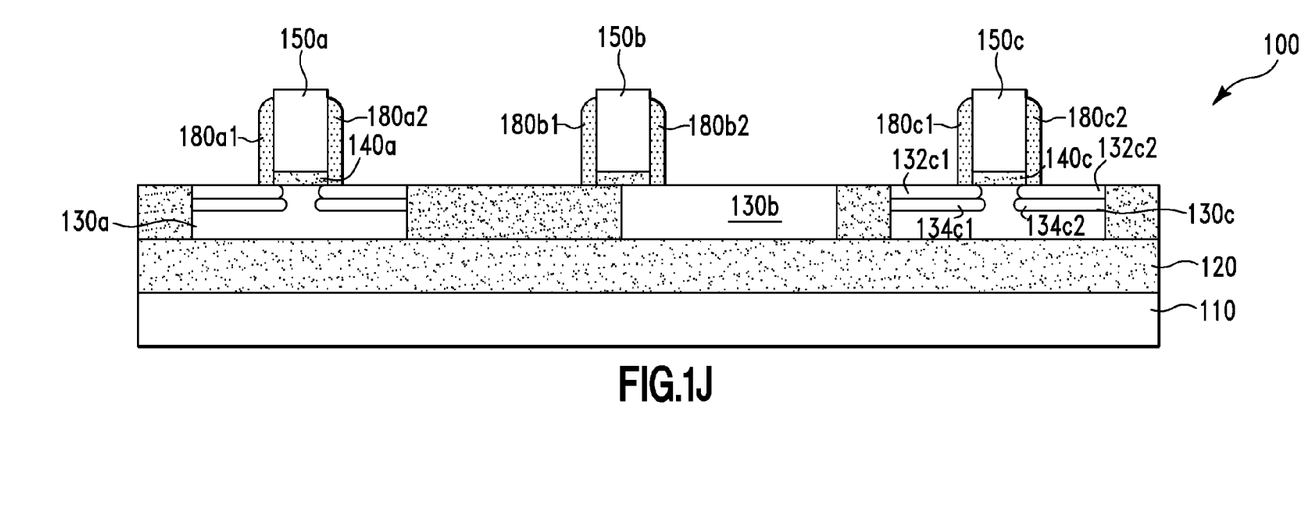
Figure 1K:
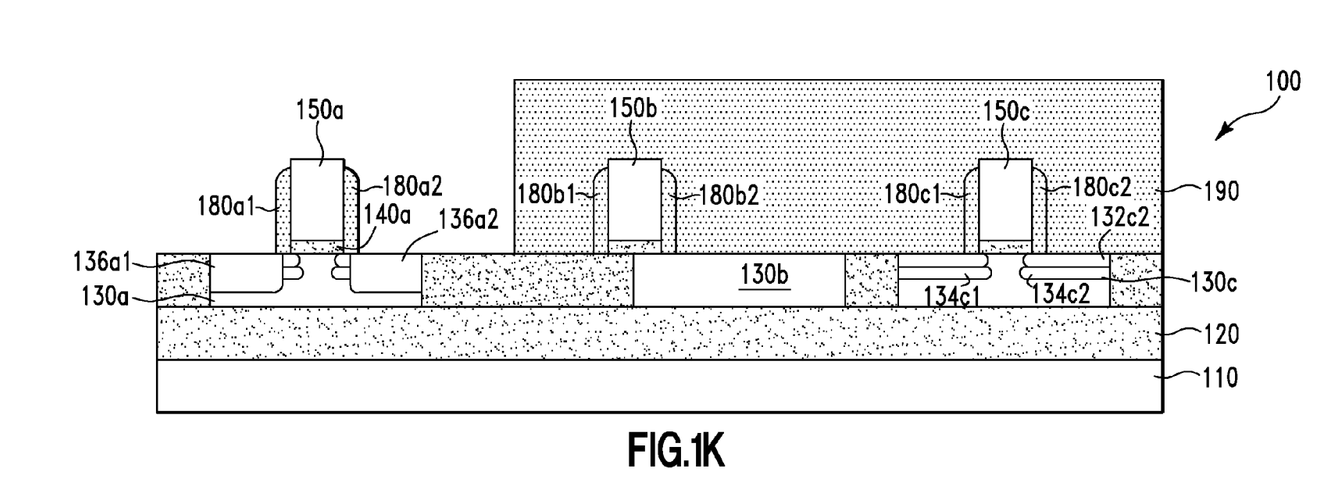
Figure 1L:
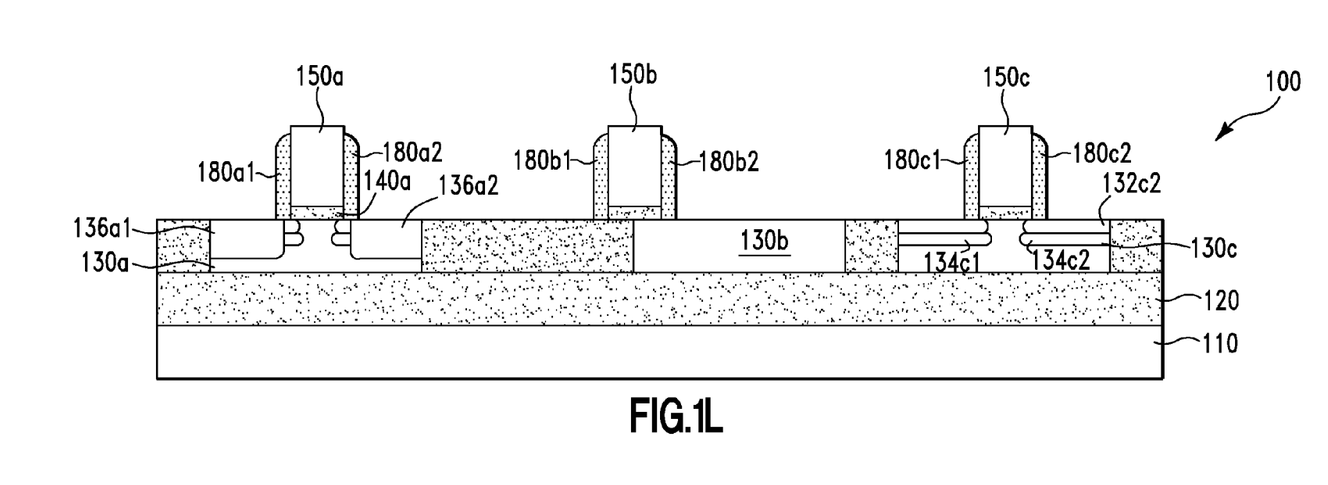
Figure 1M:
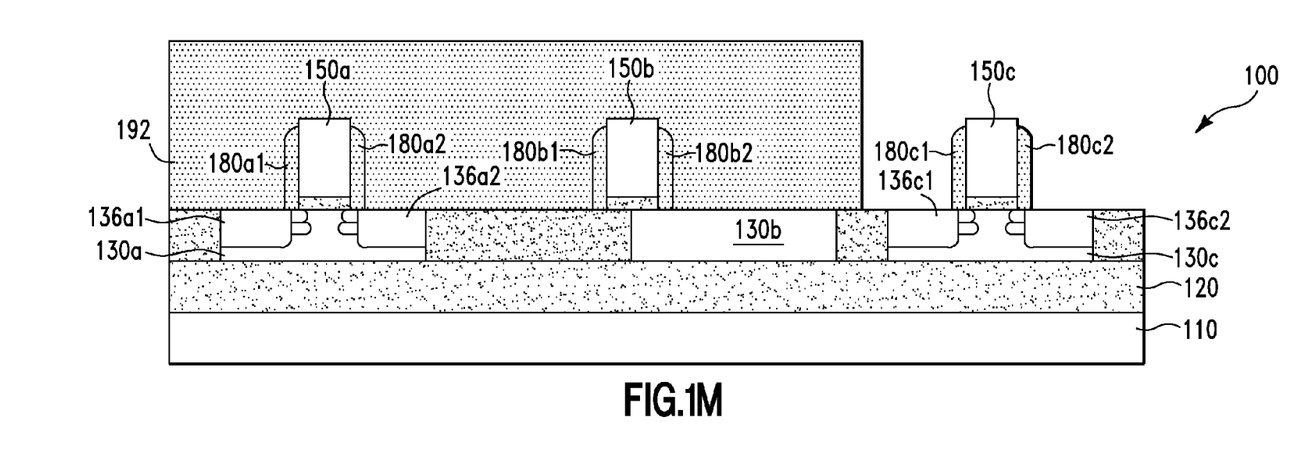
Figure 1N:
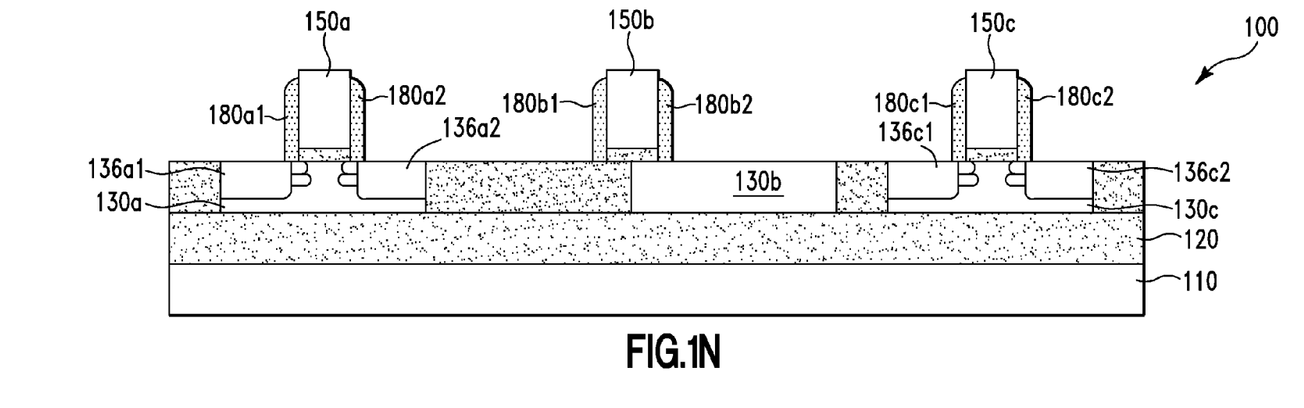
Figure 1O:
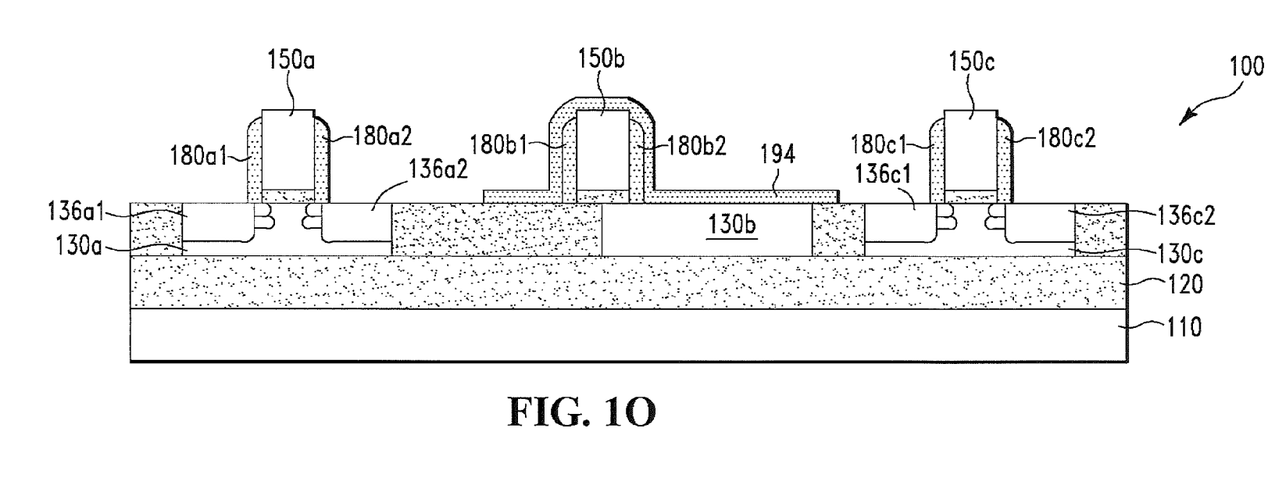
Figure 1P:
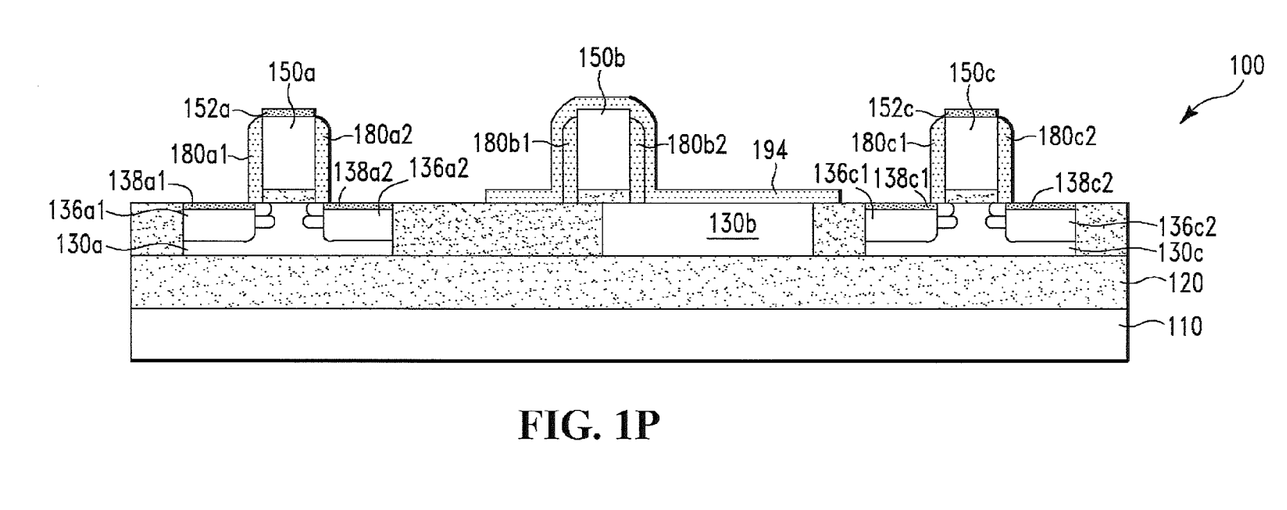
Figure 1Q:
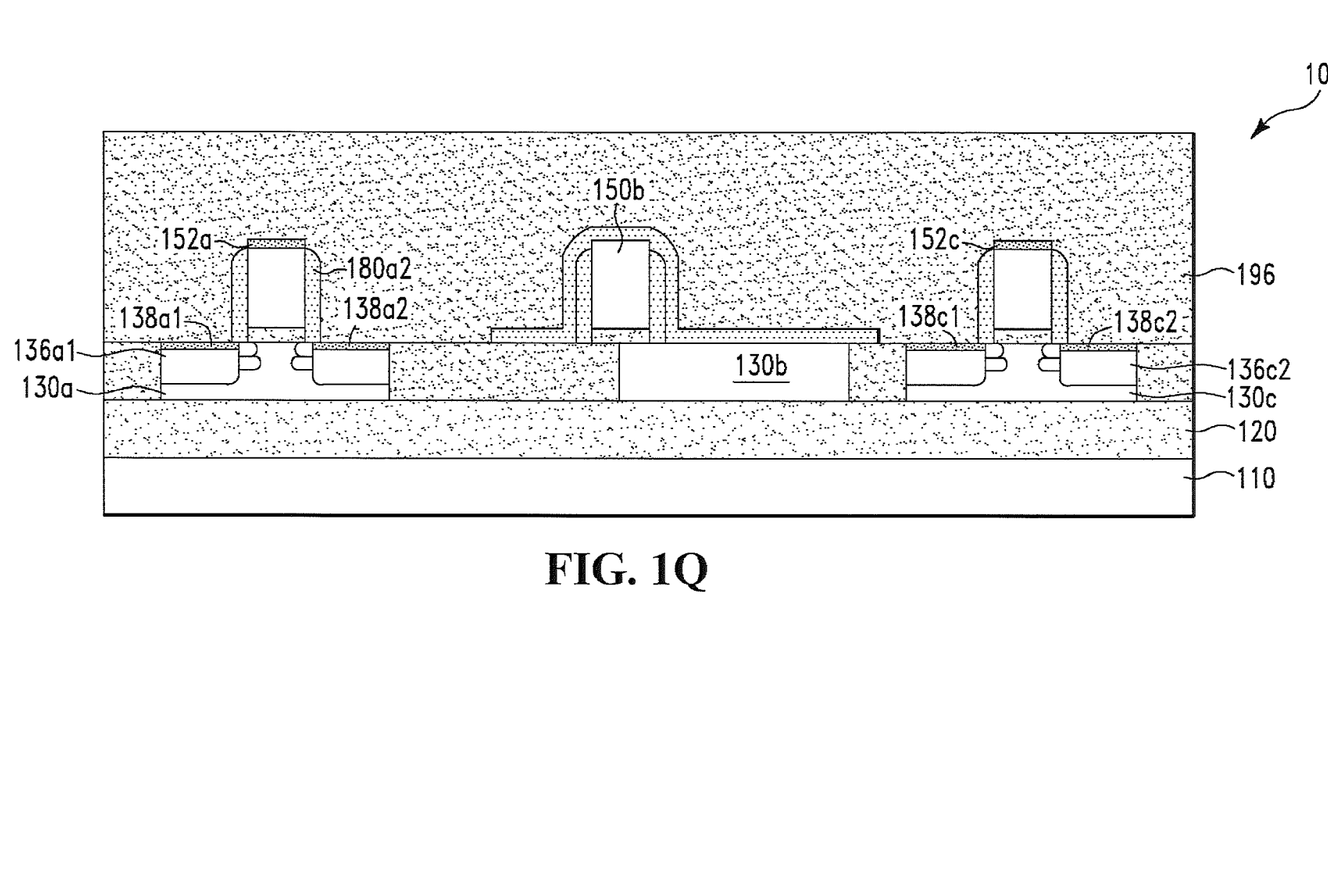

FIGS. 1A-1Q show cross-section views used to illustrate a fabrication process for forming a semiconductor structure 100, in accordance with embodiments of the present invention. More specifically, with reference to FIG. 1A, the fabrication process starts with an SOI (Silicon On Insulator) substrate 110+120+130. The SOI substrate 110+120+130 comprises a silicon layer 110, a silicon dioxide layer 120 on top of the silicon layer 110, and a silicon layer 130 on top of the silicon dioxide layer 120. The SOI substrate 110+120+130 can be formed by a conventional method.

Next, with reference to FIG. 1B, in one embodiment, shallow trench isolation (STI) regions 122 are formed in the silicon layer 130 resulting in silicon regions 130a, 130b, and 130c. The STI regions 122 can comprise silicon dioxide. The STI regions 122 can be formed by a conventional method. In one embodiment, the silicon regions 130a and 130c are actual active silicon regions on which transistors will later be formed, whereas the silicon region 130b is a dummy active silicon region to provide a uniform pattern density of silicon regions across the semiconductor structure 100. It should be noted that no transistor will be formed on the dummy active silicon region 130b.

Next, with reference to FIG. 1C, in one embodiment, a gate dielectric layer 140 is formed on top of the semiconductor structure 100 of FIG. 1B. The gate dielectric layer 140 can comprise silicon dioxide. The gate dielectric layer 140 can be formed by thermal oxidation, nitridation, or CVD (Chemical Vapor Deposition), atomic layer deposition (for high-k dielectrics) or other known means.

Next, with reference to FIG. 1D, in one embodiment, a gate electrode layer 150 is formed on top of the gate dielectric layer 140. The gate electrode layer 150 can comprise polysilicon, or a suitable metal, or metal/polysilicon stack. The gate electrode layer 150 can be formed by CVD, sputtering, or other means of deposition.

Next, in one embodiment, the gate dielectric layer 140 and the gate electrode layer 150 are patterned resulting in (i) gate dielectric regions 140a, 140b, and 140c and (ii) gate electrode regions 150a, 150b, and 150c, respectively, as shown in FIG. 1E. More specifically, the gate dielectric layer 140 and the gate electrode layer 150 can be patterned using lithographic and etching processes. In one embodiment, the patterning of the gate electrode layer 150 (FIG. 1D) described above results in not only the gate electrode regions 150a, 150b, and 150c (FIG. 1E) but also resistor regions (not shown) which can be used as resistors in semiconductor structure 100. In one embodiment, with reference to FIG. 1E, the actual active silicon region 130a and the gate electrode region 150a (also called an actual gate electrode region) are later used to form a PFET (p-channel field effect transistor), whereas the actual active silicon region 130c and the gate electrode region 150c (also called an actual gate electrode region) are later used to form an NFET (n-channel field effect transistor). In one embodiment, the gate electrode region 150b is used as a dummy gate electrode region to provide a uniform pattern density of gate electrode regions across the semiconductor structure 100. It should be noted that the dummy gate electrode region 150b will not be used to form any transistor. It should be noted that the locations of the dummy active silicon region 130b and the dummy gate electrode region 150b are independent from each other. It just happens that, in FIG. 1E, the dummy gate electrode region 150b overlaps the dummy active silicon region 130b in the vertical direction (i.e., the direction which is perpendicular to a top surface 131 of silicon layer 130 of FIG. 1A).

Next, with reference to FIG. 1F, in one embodiment, a photoresist layer 160 is formed on top of the gate electrode regions 150b and 150c and the silicon regions 130b and 130c such that the actual active silicon region 130a and the actual gate electrode region 150a are exposed to the surrounding ambient. The photoresist layer 160 can be formed by a conventional lithographic process.

Next, in one embodiment, halo regions 134a1 and 134a2 and extension regions 132a1 and 132a2 are formed in the actual active silicon region 130a. More specifically, the halo regions 134a1 and 134a2 and the extension regions 132a1 and 132a2 can be formed by implanting ions (p-type dopants for extension regions 132a1 and 132a2 and n-type dopants for halo regions 134a1 and 134a2) in the actual active silicon region 130a using the photoresist layer 160 as a blocking mask.

Next, in one embodiment, the photoresist layer 160 is removed resulting in the semiconductor structure 100 of FIG. 1G. The photoresist layer 160 can be removed by wet etching.

Next, with reference to FIG. 1H, in one embodiment, a photoresist layer 170 is formed on top of the gate electrode regions 150b and 150a and the silicon regions 130b and 130a such that the actual active silicon region 130c and the actual gate electrode region 150c are exposed to the surrounding ambient. The photoresist layer 170 can be formed by a conventional lithographic process.

Next, in one embodiment, halo regions 134c1 and 134c2 and extension regions 132c1 and 132c2 are formed in the actual active silicon region 130c. More specifically, the halo regions 134c1 and 134c2 and the extension regions 132c1 and 132c2 can be formed by implanting ions (n-type dopants for extension regions 132c1 and 132c2 and p-type dopants for halo regions 134c1 and 134c2) in the actual active silicon region 130c using the photoresist layer 170 as a blocking mask.

Next, in one embodiment, the photoresist layer 170 is removed resulting in the semiconductor structure 100 of FIG. 1I. The photoresist layer 170 can be removed by plasma etching.

Next, with reference to FIG. 1J, in one embodiment, spacer regions 180a1, 180a2, 180b1, 180b2, 180c1, and 180c2 are formed on side walls of the gate electrode regions 150a, 150b, and 150c. The spacer regions 180a1, 180a2, 180b1, 180b2, 180c1, and 180c2 can comprise silicon nitride. The spacer regions 180a1, 180a2, 180b1, 180b2, 180c1, and 180c2 can be formed by (i) depositing a spacer layer (not shown) on top of the semiconductor structure 100 of FIG. 1I and then (ii) anisotropically (vertically) etching the spacer layer resulting in the spacer regions 180a1, 180a2, 180b1, 180b2, 180c1, and 180c2.

Next, with reference to FIG. 1K, in one embodiment, a photoresist layer 190 is formed on top of the silicon regions 130b and 130c and the gate electrode regions 150b and 150c such that the actual active silicon region 130a and the actual gate electrode region 150a are exposed to the surrounding ambient. The photoresist layer 190 can be formed by a conventional lithographic process.

Next, in one embodiment, source/drain regions 136a1 and 136a2 are formed in the actual active silicon region 130a. More specifically, the source/drain regions 136a1 and 136a2 can be formed by implanting ions (p-type dopants such as boron ions) in the actual active silicon region 130a using the photoresist layer 190 as a blocking mask.

Next, in one embodiment, the photoresist layer 190 is removed resulting in the semiconductor structure 100 of FIG. 1L. The photoresist layer 190 can be removed by wet etching.

Next, with reference to FIG. 1M, in one embodiment, a photoresist layer 192 is formed on top of the silicon regions 130b and 130a and the gate electrode regions 150b and 150a such that the actual active silicon region 130c and the actual gate electrode region 150c are exposed to the surrounding ambient. The photoresist layer 192 can be formed by a conventional lithographic process.

Next, in one embodiment, source/drain regions 136c1 and 136c2 are formed in the actual active silicon region 130c. More specifically, the source/drain regions 136c1 and 136c2 can be formed by implanting ions (n-type dopants such as phosphorous ions) in the actual active silicon region 130c using the photoresist layer 192 as a blocking mask.

Next, in one embodiment, the photoresist layer 192 is removed resulting in the semiconductor structure 100 of FIG. 1N. The photoresist layer 192 can be removed by wet etching. It should be noted that because of the photoresist layers 160 (FIG. 1F), 170 (FIG. 1H), 190 (FIG. 1K), and 192 (FIG. 1M), the dummy active silicon region 130b and the dummy gate electrode region 150b are protected from ion bombardment that formed halo regions, extension regions, and source/drain regions of the PFET and the NFET mentioned above.

Next, with reference to FIG. 1O, in one embodiment, a dielectric cap region 194 is formed on top of the dummy active silicon region 130b and the dummy gate electrode region 150b. More specifically, the dielectric cap region 194 can comprise a dielectric material such as silicon nitride. The dielectric cap region 194 can be formed by (i) depositing a dielectric cap layer (not shown) on top of the semiconductor structure 100 of FIG. 1N and then (ii) patterning the dielectric cap layer resulting in the dielectric cap region 194. In one embodiment, said patterning the dielectric cap layer results in not only the dielectric cap region 194 but also other dielectric cap regions covering resistor regions (which are described above with reference to FIG. 1E) such that no surface of the resistor regions is exposed to the surrounding ambient. Because of the dielectric cap region 194, it is more difficult for the dummy active silicon region 130b and the dummy gate electrode region 150b to fall off the semiconductor structure 100 under subsequent etching processes. In an alternative embodiment, the dielectric cap region 194 can be formed earlier. In one embodiment, the dielectric cap region 194 can be formed on top of the dummy active silicon region 130b and the dummy gate electrode region 150b in FIG. 1E.

Next, with reference to FIG. 1P, in one embodiment, (i) silicide regions 138a1, 138a2, and 152a are formed on the source/drain regions 136a1 and 136a2 and the actual gate electrode region 150a, respectively, as shown, and (ii) silicide regions 138c1, 138c2, and 152c are formed on the source/drain regions 136c1 and 136c2 and the actual gate electrode region 150c, respectively, as shown. The silicide regions 138a1, 138a2, 152a, 138c1, 138c2, and 152c can be formed by (i) depositing a metal layer (not shown) on top of the semiconductor structure 100 of FIG. 1O, then (ii) heating the semiconductor structure 100 resulting in the metal chemically reacting with silicon of the source/drain regions and the actual gate electrode regions, and then (iii) removing unreacted metal resulting in the silicide regions 138a1, 138a2, 152a, 138c1, 138c2, and 152c. It should be noted that because of the dielectric cap region 194, no silicide region is formed on top of the dummy active silicon region 130b and the dummy gate electrode region 150b. Also, because of other dielectric cap regions covering resistor regions (described above) such that no surface of the resistor regions is exposed to the surrounding ambient, no silicide region is formed on top the resistor regions as a result of the silicidation described above. It should be noted that the other dielectric cap regions covering resistor regions do not prevent the resistor regions from being doped during the formation of the halo regions, the extension regions, and the S/D regions of the structure 100 (described above).

Next, with reference to FIG. 1Q, in one embodiment, a dielectric layer 196 is formed on top of the semiconductor structure 100 of FIG. 1P. More specifically, the dielectric layer 196 can be formed by CVD of a dielectric material on top of the semiconductor structure 100 of FIG. 1P.

Next, in one embodiment, contact regions (not shown) are formed in the dielectric layer 196 to provide electrical access to the source/drain regions 136a1, 136a2, 136c1, and 136c2 and the gate electrode regions 150a and 150b.

In summary, with reference to FIG. 1N, in the process for forming the PFET and the NFET mentioned above, (i) no dopant enters and (ii) no silicide is formed on top of the dummy active silicon region 130b and the dummy gate electrode region 150b. As a result, the dummy active silicon region 130b and the dummy gate electrode region 150b have higher resistances than the case in which the dummy active silicon region 130b and the dummy gate electrode region 150b are not protected from ion bombardments and silicidation during the formation of the PFET and the NFET mentioned above.

Next, in one embodiment, one interconnect layer after another (not shown) is formed on top of the structure 100 of FIG. 1Q. In one embodiment, the formation of the interconnect layers also results in an inductor (not shown in FIG. 1Q but can be seen as an inductor 220 in FIG. 1R).

Figure 1R:
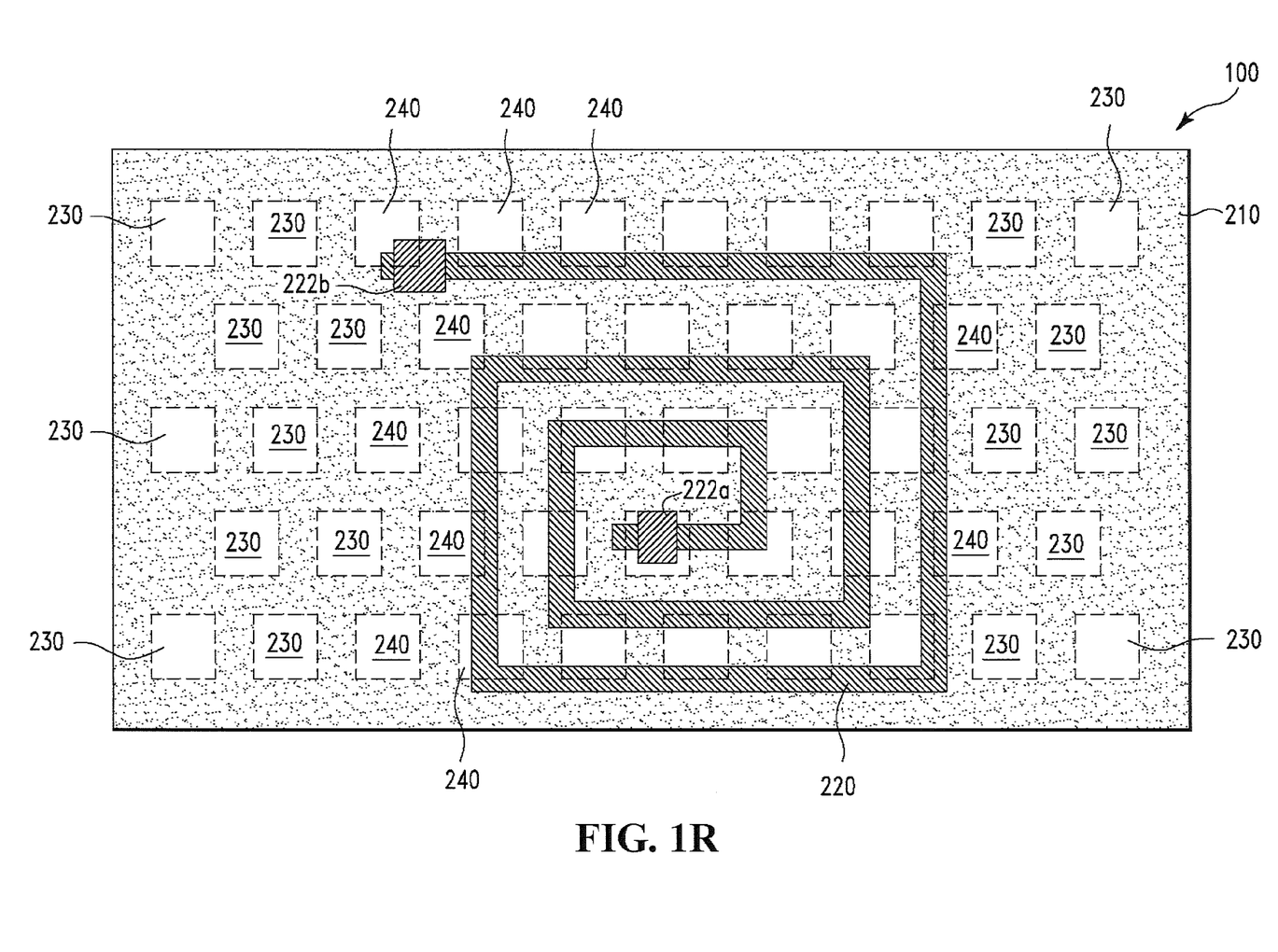

FIG. 1R shows a top-down zoom-out view of the resulting structure 100 after the formation of the interconnect layers including the inductor 220, in accordance with embodiments of the present invention. In addition to the actual active silicon regions 130a and 130c, the structure 100 comprises other actual active silicon regions similar to the actual active silicon regions 130a and 130c. In addition to the actual gate electrode regions 150a and 150c, the structure 100 comprises other actual gate electrode regions similar to the actual gate electrode regions 150a and 150c. In addition to the dummy active silicon region 130b, the structure 100 comprises other dummy active silicon regions similar to the dummy active silicon region 130b. In addition to the dummy gate electrode region 150b, the structure 100 comprises other dummy gate electrode regions similar to the dummy gate electrode region 150b.

In one embodiment, with reference to FIG. 1R, each actual feature 230 can represent any one region of (i) the actual active silicon regions and (ii) the actual gate electrode regions of the structure 100, whereas each dummy feature 240 can represent any one region of (i) the dummy active silicon regions and (ii) the dummy gate electrode regions of the structure 100. Although the actual and dummy gate electrode regions and the actual and dummy active silicon regions can (i) overlap one another in the vertical direction, (ii) be of different sizes and shapes, and (iii) be not distributed uniformly across the structure 100 as shown in FIG. 1Q, but in FIG. 1R, for simplicity, the features 230 and 240 (i) do not overlap one another in the vertical direction, (ii) are of the same size and shape, and (iii) are distributed uniformly across the structure 100 of FIG. 1R. In one embodiment, contact regions 222a and 222b are used to provide electrical access to the inductor 220.

In one embodiment, all the actual features 230 do not overlap the inductor 220 in the vertical direction. In one embodiment, all the dummy features 240 were protected from ion bombardments and silicidation during the formation of the PFET and the NFET mentioned above. In one embodiment, some dummy features 240 overlap the inductor 220 in the vertical direction, whereas other dummy features 240 do not overlap the inductor 220 in the vertical direction. Alternatively, all the dummy features 240 overlap the inductor 220 in the vertical direction.

Assume that an electric current flows in the inductor 220. As a result, the current creates around the inductor 220 a magnetic field (not shown) in which the dummy features 240 reside. Because the dummy features 240 were protected from the ion bombardments and the silicidation resulting in the resistances of the dummy features 240 not being reduced as in the prior art, (i) the loss of the inductance of the inductor 220 due to the presence of electrically conductive regions in the magnetic field is minimized and (ii) the energy dissipation caused by eddy currents induced by the magnetic field of the inductor 220 in the dummy features 240 is also minimized.

In summary, as a result of (i) the actual features 230 being away (i.e., not overlapping in the vertical direction) from the inductor 220 and (ii) the resistances of the dummy features 240 not being reduced, (i) the loss of the inductance of the inductor 220 due to the presence of electrically conductive regions in the magnetic field is minimized and (ii) the energy dissipation caused by eddy currents induced by the magnetic field of the inductor 220 in the dummy features 240 is also minimized.

In one embodiment, the entire inductor 220 resides in a single interconnect layer. In an alternative embodiment, the inductor 220 resides in multiple interconnect layers of the structure 100. More specifically, the inductor 220 comprises multiple segments which are electrically coupled together by vias (not shown).

In the embodiments described above, the actual features 230 do not overlap the inductor 220 in the vertical direction. In an alternative embodiment, the distance from any actual feature 230 to the inductor 220 in the horizontal direction (i.e., the direction which is perpendicular to the vertical direction) is at least a pre-specified minimum distance (e.g., 3 μm).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
   (a) a substrate which includes a top substrate surface which defines a reference direction perpendicular to the top substrate surface;
   (b) N semiconductor regions on the substrate, N being a positive integer,
      wherein the N semiconductor regions comprise dopants;
   (c) P semiconductor regions on the substrate, P being a positive integer,
      wherein the P semiconductor regions do not comprise dopants; and
   (d) M interconnect layers on top of the substrate, the N semiconductor regions, and the P semiconductor regions, M being a positive integer,
      wherein the M interconnect layers include an inductor,
      wherein all of the N semiconductor regions in the reference direction do not overlap the inductor,
      wherein all of the P semiconductor regions in the reference direction overlap the inductor, and
      wherein a plane perpendicular to the reference direction and intersecting a semiconductor region of the N semiconductor regions intersects a semiconductor region of the P semiconductor regions.

2. The structure of claim 1,
   wherein each semiconductor region of the P semiconductor regions is not in direct physical contact with any silicide region, and
   wherein each semiconductor region of the N semiconductor regions is in direct physical contact with a silicide region.

3. The structure of claim 1,
   wherein the N semiconductor regions comprise N1 semiconductor regions and N2 semiconductor regions, N1 and N2 being positive integers,
   wherein N1 plus N2 is equal to N, wherein the N1 semiconductor regions of the N semiconductor regions comprise p-type dopants, and wherein the N2 semiconductor regions of the N semiconductor regions comprise n-type dopants.

4. The structure of claim 1, further comprising Q semiconductor regions on the substrate, Q being a positive integer, wherein the Q semiconductor regions do not comprise dopants, and wherein the Q semiconductor regions do not overlap the inductor in the reference direction.

5. The structure of claim 1, wherein said inductor resides in a single interconnect layer of the M interconnect layers.

6. The structure of claim 1, wherein said inductor resides in multiple interconnect layers of the M interconnect layers.

7. A structure, comprising:
(a) a substrate which includes a top substrate surface which defines a reference direction perpendicular to the top substrate surface;
(b) N semiconductor regions on the substrate, N being a positive integer,
  wherein each semiconductor region of the N semiconductor regions is in direct physical contact with a silicide region;
(c) P semiconductor regions on top of the substrate, P being a positive integer,
  wherein each semiconductor region of the P semiconductor regions is not in direct physical contact with any silicide region; and
(d) M interconnect layers on top of the substrate, the N semiconductor regions, and the P semiconductor regions, M being a positive integer,
  wherein the M interconnect layers include an inductor,
  wherein all of the N semiconductor regions in the reference direction do not overlap the inductor,
  wherein each semiconductor region of the P semiconductor regions overlaps the inductor in the reference direction, and
  wherein a plane perpendicular to the reference direction and intersecting a semiconductor region of the N semiconductor regions intersects a semiconductor region of the P semiconductor regions.

8. The structure of claim 7,
wherein each semiconductor region of the P semiconductor regions does not comprise dopants,
wherein each semiconductor region of the N semiconductor regions comprises dopants,
wherein the N semiconductor regions comprise N1 semiconductor regions and N2 semiconductor regions, N1 and N2 being positive integers,
wherein N1 plus N2 is equal to N,
wherein the N1 semiconductor regions of the N semiconductor regions comprise p-type dopants, and
wherein the N2 semiconductor regions of the N semiconductor regions comprise n-type dopants.

9. The structure of claim 7, further comprising Q semiconductor regions on the substrate, Q being a positive integer,
wherein each semiconductor region of the Q semiconductor regions is not in direct physical contact with any silicide region, and
wherein the Q semiconductor regions do not overlap the inductor in the reference direction.

10. The structure of claim 7, wherein said inductor resides in a single interconnect layer of the M interconnect layers.

11. The structure of claim 7, wherein said inductor resides in multiple interconnect layers of the M interconnect layers.

* * * * *